(12) United States Patent
Reinisch (10) Patent No.: US 8,253,009 B2
(45) Date of Patent: Aug. 28, 2012

(54) STRIP RETAINING APPARATUS FOR A SOLAR CELL CONNECTING APPARATUS

(75) Inventor: Hubert Reinisch, Freiberg/Neckar (DE)

(73) Assignee: teamtechnik Maschinen und Anlagen GmbH, Freiberg (DE)

( * ) Notice: Subject to any disclaimer, the term of this patent is extended or adjusted under 35 U.S.C. 154(b) by 0 days.

(21) Appl. No.: 13/044,838

(22) Filed: Mar. 10, 2011

(65) Prior Publication Data

US 2011/0155790 A1 Jun. 30, 2011

Related U.S. Application Data (60) Division of application No. 12/147,935, filed on Jun. 27, 2008, which is a continuation of application No. PCT/EP2006/012580, filed on Dec. 28, 2006.

(30) Foreign Application Priority Data

Dec. 30, 2005 (DE) .......................... 10 2005 063 285
Feb. 17, 2006 (DE) .......................... 10 2006 007 447

(51) Int. Cl.
  *H02N 6/00* (2006.01)
(52) U.S. Cl. ......................................... 136/244; 29/2.23
(58) Field of Classification Search .................. 136/244; 29/2.23
  See application file for complete search history.

(56) References Cited

U.S. PATENT DOCUMENTS

| 4,334,354 A | 6/1982 | Luft et al. |
| 4,520,557 A * | 6/1985 | Harigane et al. ................. 29/740 |
| 4,534,502 A | 8/1985 | Piurek |
| 4,685,608 A | 8/1987 | Kujas |
| 2005/0217718 A1 | 10/2005 | Dings et al. |

FOREIGN PATENT DOCUMENTS

| DE | 36 12 269 A1 | 10/1987 |
| DE | 201 12 309 U1 | 12/2001 |
| DE | 102 97 633 T5 | 5/2005 |
| DE | 103 45 576 A1 | 5/2005 |
| WO | WO 96/17387 | 6/1996 |

\* cited by examiner

*Primary Examiner* — Jonathan Johnson
*Assistant Examiner* — Miriam Berdichevsky
(74) *Attorney, Agent, or Firm* — Harness, Dickey & Pierce, P.L.C.

(57) ABSTRACT

The invention relates to a solar cell connecting apparatus, for example a solar cell connecting apparatus, for manufacturing solar cell strings from individual solar cells and electrically conductive strips, having a first module for joining solar cells and strips together; a second module which is connected to the first module for connection, for example, soldering of the strips to the solar cells; and a third module for transportation of the solar cells from the first module through the second module. The connecting apparatus is characterized in that the first module has an apparatus for placing a strip retaining element on to a solar cell with strips, in order to fix the strips on the solar cell, and the third module is adapted in order to also transport the retaining element together with the solar cell (FIG. 2).

10 Claims, 10 Drawing Sheets

STRIP RETAINING APPARATUS FOR A SOLAR CELL CONNECTING APPARATUS

CROSS-REFERENCE TO RELATED APPLICATIONS

This application is a division of U.S. application Ser. No. 12/147,935, filed Jun. 27, 2008, which is a continuation of copending international patent application PCT/EP2006/012580 filed on Dec. 28, 2006 and designating the U.S. and published in German, which claims priority of German patent applications DE 10 2005 063 285 filed on Dec. 30, 2005 and DE 10 2006 007 447 filed on Feb. 17, 2006, all of the aforesaid related applications being fully incorporated herein by reference.

BACKGROUND OF THE INVENTION

The present invention relates to a solar cell connecting apparatus, preferably a solar cell soldering apparatus, for manufacturing solar cell strings from individual solar cells and electrically conductive strips, having a first module for joining solar cells and strips together, a second module which is connected to the first module (either directly or indirectly separated by other modules, etc.), for connecting the strips to the solar cells; and a third module for transportation of the solar cells from the first module through the second module. The invention also relates to a strip retaining apparatus for a solar cell connecting apparatus such as this and to a transport apparatus for a solar cell connecting apparatus.

Solar cell soldering apparatuses are generally known and used to electrically connect individual solar cells to one another, resulting in individual solar cells being connected in series to form a so-called solar cell string. By way of example, a solar cell string such as this is specified in the document DE 201 12 309 U1.

Figure 1A:
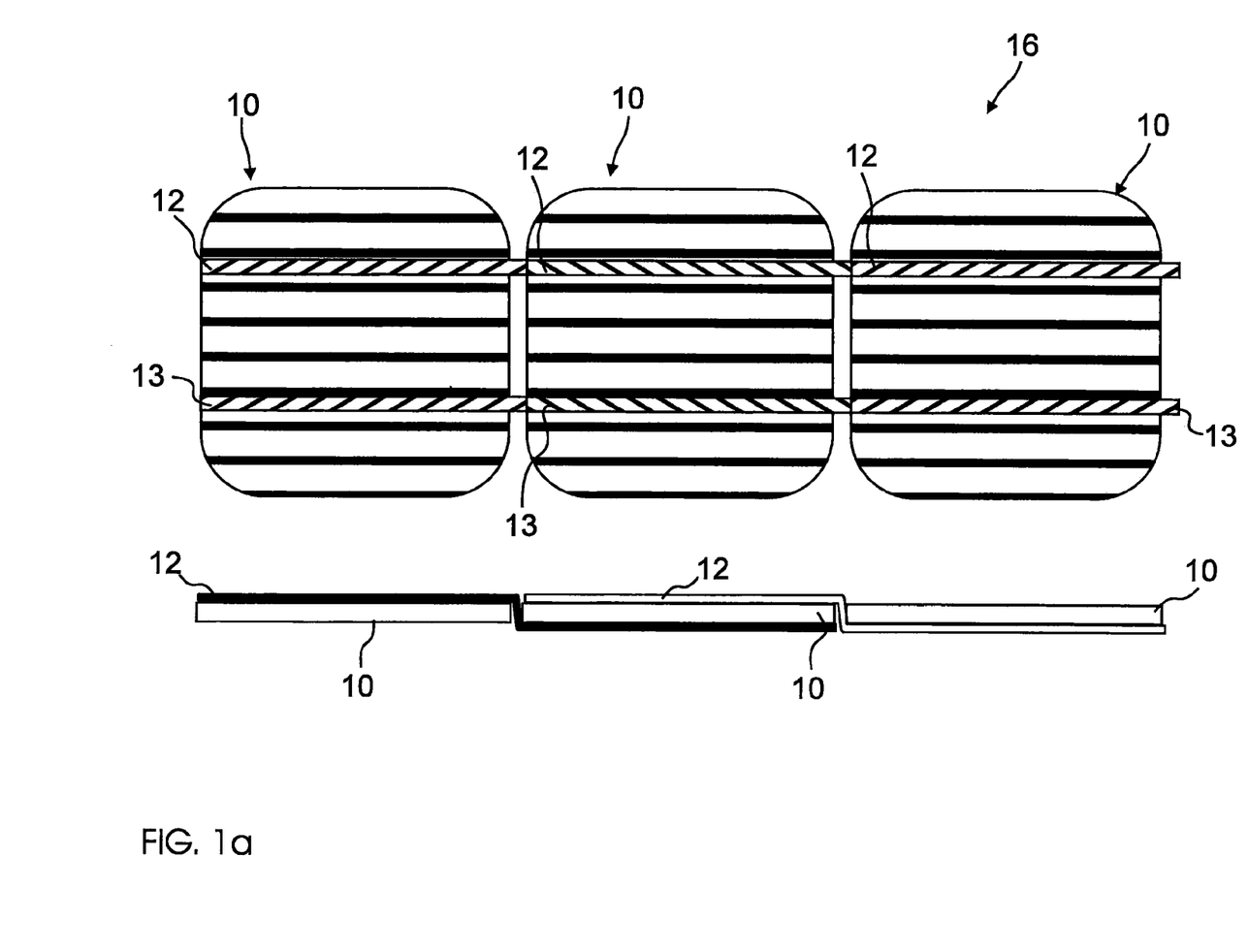
FIGS. 1a, b, c show schematic illustrations of a solar cell string comprising three solar cells.

By way of example, FIG. 1a shows a detail of a solar cell string 16. This string 16 comprises three solar cells 10, which each have a contact grid composed of individual thin electrical lines. Electrically conductive strips 12, 13 run at right angles to this contact grid and are soldered to the contact grid in order to make an electrical connection. These strips 12, 13 may extend over the entire length of a solar cell and over the length of the next adjacent solar cell, in which case the strips then pass on to the opposite face (lower face) of the solar cell, as can be seen well in FIG. 1a. In consequence, a strip pair 12, 13 connects the upper face of one solar cell 10 to the lower face of the adjacent solar cell. Furthermore, solar cells exist, as in FIG. 1b, in which one strip in each case runs transversely over the width of two adjacent solar cells and therefore connects a predecessor cell and a successor cell to one another, with appropriate polarity.

Figure 1B:
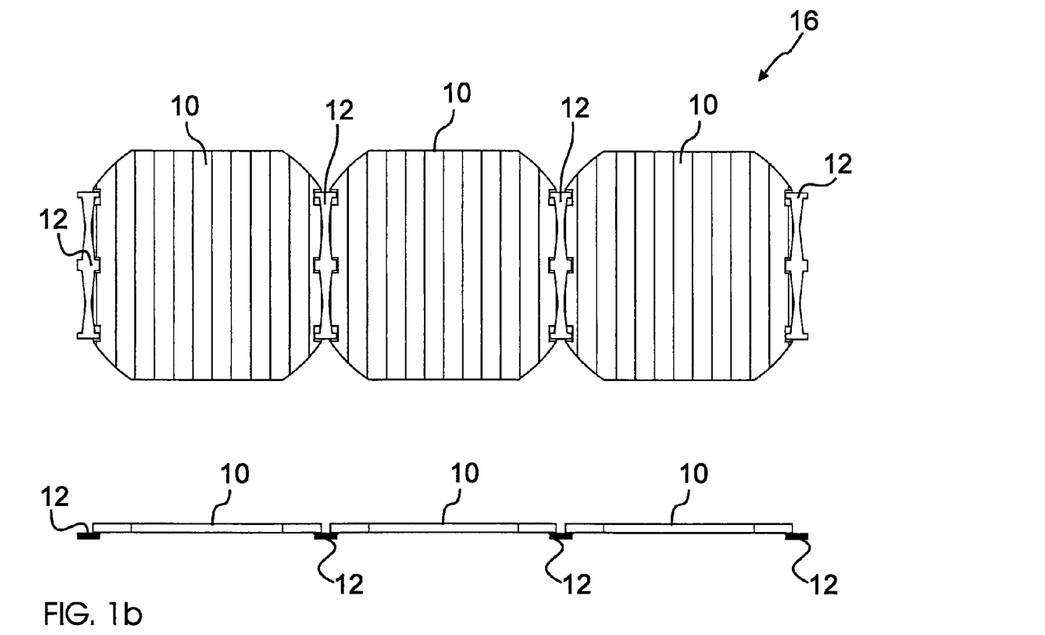
Figure 1C:
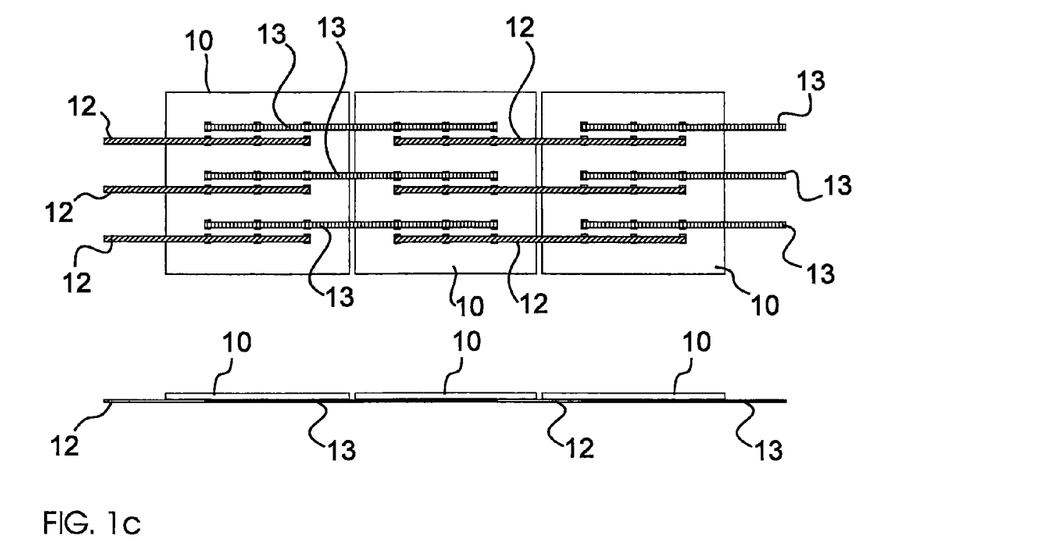

In FIG. 1c, strips likewise extend, interleaved in one another, in the longitudinal direction of adjacent cells. The strips (by way of example 5 of them) connect the rear face to the rear face of adjacent cells. Since, in FIGS. 1b and 1c, the strips are located only on the rear face of the solar cells, the expression rear-face contact cells is used in these cases.

Connections of this type are then repeated for the entire row of solar cells thus finally resulting in a solar cell string which is formed from a multiplicity of individual solar cells, with the individual solar cells being electrically connected via the strips 12, 13. The expression "strips" is used in the following text to represent an electrically conductive connector whose shape may extend from a pure strip shape (for example, FIG. 1, 1c) to geometries matched to the contours (for example, FIG. 1b).

Solar cell soldering apparatuses have been proposed, for example, those in DE 102 97 633 T5, in order to produce a solar cell string 16 such as this. In the solar cell arrangement machine disclosed there, the solar cells to be connected are located on a plate which is passed through the machine with the aid of stepping motors. Gripping elements are provided on this plate, grip the individual solar cells, and fix their positions with respect to one another. The strips which are required to connect the individual solar cells are placed down, are likewise firmly clamped to the solar cell and are then moved through a soldering station.

The use of a plate for transportation of the solar cell string is disadvantageous, inter alia with regard to a high cycle rate. Furthermore, it has little flexibility in terms of different solar cell sizes, distances between the solar cells in the string (gap size) and a different number of solar cells in a solar cell string. There are disadvantages, likewise, in the various zones of the connecting process (for example, preheating, soldering, cooling-down zones), which require specific process parameters because of the high quality of the connection process and may extend over relatively long path lengths. Furthermore, the number of solar cells to be connected is dependent on the length of the horizontally moving plate. When the plate is moved back, this results in a movement with no load, with a negative effect on the yield.

SUMMARY OF THE INVENTION

Against this background, the object of the present invention is, inter alia, to provide a solar cell connecting apparatus which no longer has these disadvantages. One particular aim is to allow the solar cell connecting apparatus to be used flexibly, to allow a high throughput and to have as large as possible a spatial (for example "zone length") and process independence from the connection technology being used (for example a soldering process).

This object is achieved for a solar cell connection apparatus mentioned initially in that the first module has an apparatus for supplying a strip retaining element by means of which the strips are fixed on the solar cell during transportation, and the third module is designed in order to transport the retaining element together with the solar cell and the strips fixed to it.

In other words, and in contrast to the solar cell arrangement machine explained initially, this means that the solar cell connection apparatus according to the invention makes use of continuous-flow manufacturing principles in order to make it possible to produce a flexible apparatus with a high throughput. The individual solar cells which are arranged to form a solar cell string are therefore, according to the invention, not held on a transport plate by means of gripping elements, but are in fact placed directly or indirectly on conveyer belts and are transported through the individual processing stations, in particular a soldering station. In this context, indirectly means that there is a further component between the conveyer belts and the solar cell, that is to say, the solar cell is located, in consequence, on the component which itself is located on the conveyer belts. In order to fix the electrically conductive strips which are required for connection of the individual solar cells, on a solar cell, strip retaining elements are used which are placed on the strips, for example once the strips have been placed on the solar cell, and therefore press the strip elements against the solar cell and fix them. The corresponding retaining element is then transported further together with the solar cell and is lifted off again after passing through the soldering station.

For the purposes of this description, the expressions connection and soldering are used to represent any desired construction and connection technique for electrical connection (for example, soldering, conductive adhesion, etc.) of the solar cells. Furthermore, at this point it should be noted that the second module for connection of the strips need not necessarily be immediately adjacent to the first module. Further modules could be provided between the first and the second module.

This manufacturing technique allows the number of individual solar cells forming a string to be varied easily, since no physical changes are required. Furthermore, the solar cells can be passed through the system in a continuous step-by-step movement. In consequence, there is no need to transport a transport plate back after completion of a string as is necessary in the prior art cited above so it is possible to save this wasted time.

In one preferred embodiment of the solar cell soldering apparatus according to the invention, the third module has a first transport device which comprises a first conveyer belt which supports the solar cell. Furthermore, the first conveyer belt preferably has a plurality of suction openings which are arranged in the transport direction and interact with suction boxes in order to fix solar cells located on the conveyer belt thereon.

This measure has been found to be particularly advantageous in order to fix the solar cells in position on the conveyer belt simply, precisely and in particular without risk of damage. Accurate position fixing is required until the strips which connect the individual solar cells have been connected, that is to say firmly soldered.

In one preferred embodiment, the third module has a second transport device which comprises two parallel-arranged conveyer belts on which the strip retaining element rests for transportation. The two parallel conveyer belts preferably have suction openings which are arranged in the longitudinal direction and interact with suction boxes in order to fix the retaining elements on the conveyer belts. This embodiment allows the retaining elements to be placed on these two conveyer belts as required in the string production direction, for example, without having to ensure coordination of molded elements, etc.

These measures have likewise been found to be advantageous. The separation of the conveyer belts for the solar cells and the retaining elements allows mechanical decoupling, so that mechanical influences on the conveyer belt for the solar cells can be reduced. Furthermore, this measure has cost advantages since, for example, if the solar cell sizes change, only their conveyer belt need be changed while, however, the two conveyer belts which run parallel thereto for the retaining elements can remain.

In the embodiment explained above, the first conveyer belt is used on the one hand to support the strips and solar cell and on the other hand to transport the solar cell. In an alternative embodiment, these two functions can also be provided by the retaining element resting on the second conveyer belts. In this case, there will be no need for the first conveyer belt.

In a first embodiment, the retaining element is provided with supporting elements which support the lower strips and the solar cell. Since the retaining element is resting on the second conveyer belt, this therefore results in the solar cell also being transported, together with the retaining element.

In a further embodiment, the retaining element is formed in two parts, for example, comprising a baseplate and the actual retaining element, which is placed on the baseplate. The baseplate itself rests on the second conveyer belts and is used to support the solar cell and the strips. The retaining element is placed on the baseplate, once the solar cell has been placed down. In brief, in this embodiment, the function of the first conveyer belt is replaced by the baseplate.

Further embodiments are, of course, feasible without departing from the scope of the invention as defined in the claims.

In one preferred embodiment, the first and the second transport device have a common drive device.

This measure has the advantage that, on the one hand, costs for the provision of a second drive can be saved, and on the other hand there is no need for other measures for synchronization of the transport speeds of the two conveyer belts, if they are driven by the same motor.

In one preferred embodiment, the third module has a third transport device which is designed to lift retaining elements off the solar cell at the end of the second module, and to transport them back to the first module.

This measure has the advantage that, for continuous-flow manufacturing purposes, the retaining elements which are no longer required after the connection process, preferably soldering, can be fed back in order to then be placed on the solar cells again. This allows a closed circuit to be provided for the retaining elements.

In one preferred embodiment, a connecting device, preferably a soldering oven or a soldering device for any required preheating, soldering and possible smooth cooling down of the strips on the solar cells, is provided in the second module, with the solar cells passing through the soldering oven, lying on the conveyer belt, together with the retaining element.

In one preferred embodiment, the first transport device has a bar device which comprises a plurality of bars extending in the transportation direction, on which the conveyer belts rest, with the bars being designed in order to compensate for the thickness of the strip located between the solar cell and the conveyer belt. Rear-face contact cells are processed without any height offset. The bars are preferably designed to be interchangeable.

In other words, this means that a total of three (or, for example, five, depending on the solar cell size, type and arrangement of the strips) parallel-arranged conveyer belts are used for transportation of the solar cells, and are supported from underneath by so-called bars.

The conveyer belts are arranged such that the two outer conveyer belts are located underneath the strips. In order now to compensate for the lack of thickness of a strip with respect to the central conveyer belt, the central bar can be increased in height by approximately the thickness of the strip.

This makes it possible to ensure that the solar cell rests absolutely flat on the conveyer belts, this making it possible to avoid fracture damage.

Since the bars are designed to be interchangeable, changes can be made very quickly, in order to adapt the apparatus to other solar cell types and strip thicknesses.

In other words, the bars effectively act as adapters, providing height compensation between the strip area and the "non-strip area".

In one preferred embodiment the individual bars have longitudinal sections which have suction openings which interact with the suction boxes to provide suction for the solar cells.

This measure has the advantage that the suction response can be adjusted very flexibly by the use of different bars. If longitudinal sections of the bars are provided without openings, areas can be created without suction. Furthermore, the area subject to suction and the suction power can be adjusted by different "grid spacings" of suction openings in the bar.

In consequence, the use of interchangeable bars allows highly variable adjustment of the suction characteristics in addition to the adaptor function already mentioned above.

Furthermore, the bars can be used to produce optimum process parameters for the construction and connection technique (thermal energy by heating the bar in places, cooling the bar in places, insulation of the bar (thermally), etc.).

As already mentioned, the invention also relates to so-called strip retaining apparatuses which may be used in the solar cell connecting apparatus, in particular the solar cell soldering apparatus according to the invention. According to the invention, a strip retaining apparatus has a frame or c-shaped mount, which has contact surfaces on its two edge areas which are preferably designed in order to rest flat on conveyer belts, and which has a window in the central area, a multiplicity of retaining heads which are arranged, for example, in two rows at the side of the window and each have a retaining needle, with the retaining heads being held on the frame such that they can pivot, such that the retaining needles can be moved on to a strip underneath the window.

In other words, this means that the strip retaining apparatus according to the invention has retaining heads whose needles press the strips on to the solar cell when the retaining apparatus is placed on a solar cell, and thus fixing them. The force applied to the strips via the retaining needles is produced by the force of gravity from the respective retaining head and/or by spring force which leads to pivoting of the retaining head.

Depending on the configuration of the solar cell connecting apparatus, the retaining apparatus is appropriately adapted. As already mentioned, embodiments of the solar cell connecting apparatus are feasible in which the first conveyer belt, which supports and transports the solar cells, is omitted. In this case, the strip retaining apparatus carries out the function of this conveyer belt, in particular the supporting function. The retaining apparatus preferably has supporting elements in the area of the (no longer present) first conveyer belt, on which the solar cell is placed.

These supporting elements are preferably in the form of narrow, physically small needle-like elements in order to allow good access in particular underneath to the solar cell lower face.

Alternatively, the supporting element can also be in the form of a baseplate which rests on the second conveyer belts and, once the solar cell has been placed, holds the actual retaining element.

In order to improve flexibility, and safety with regard to damage to cells or strips and the process safety, the retaining needles have resilient, preferably meandering sections, so that they can flex when making contact with the strip.

This makes it possible to compensate for tolerances relating to the thickness of the strips and manufacturing tolerances in the retaining heads, in a simple manner.

There is therefore no longer any need, overall, as in the case of the prior art, to firmly clamp the strips on the solar cell by means of gripping elements. In fact, it is sufficient to fix the strips precisely just by applying a retaining force acting in only one direction.

In one preferred embodiment, a bearing bar, which is in each case associated with a row of retaining heads, is provided with a V-shaped groove, with the retaining heads being mounted in the groove such that they can pivot.

In other words, this means that the retaining heads are not clamped in firmly but lie more or less loosely in the V-shaped groove and are secured against falling out by means of a corresponding opposite bar. The retaining heads are in consequence not clamped firmly in the frame.

This has the advantage that the temperature fluctuations which occur while passing through the apparatus, and the material expansion resulting from them cannot result in jamming, etc. If the retaining force is applied by means of the force of gravity, this furthermore results in highly reproducible force application, without any fatigue, as is possible for example, in the case of springs.

As mentioned, the invention also relates to a transport apparatus for solar cell connecting apparatus, in particular for the solar cell connecting apparatus according to the invention. The transport apparatus is distinguished in that at least one bar is provided which extends in the transport direction, and a recess is provided in the transport apparatus frame, which recess runs in the transport direction and is designed in order to hold the bar such that it can be replaced, with the bar supporting the conveyer belt when in the inserted state.

The function and the advantages of a bar such as this have already been explained in conjunction with the solar cell connecting apparatus according to the invention, and they will not therefore be described in any more detail here.

Further advantages and embodiments of the invention will become evident from the description and the attached drawings. It is self-evident that the features mentioned above and those still to be explained in the following text can be used not only in the respectively stated combination but also in other combinations or on their own without departing from the scope of the present invention.

BRIEF DESCRIPTION OF THE DRAWINGS

The invention will now be explained in more detail using exemplary embodiments and with reference to the drawing, in which:

FIGS. 4a-e show various views of a strip retaining element according to the invention;

FIGS. 5a, b, c show various views of a strip retaining element according to the invention, based on an alternative to that shown in FIG. 4;

FIGS. 6a-c show schematic views of a transport apparatus according to the invention with bars.

DETAILED DESCRIPTION OF PREFERRED EMBODIMENTS

Figure 2:
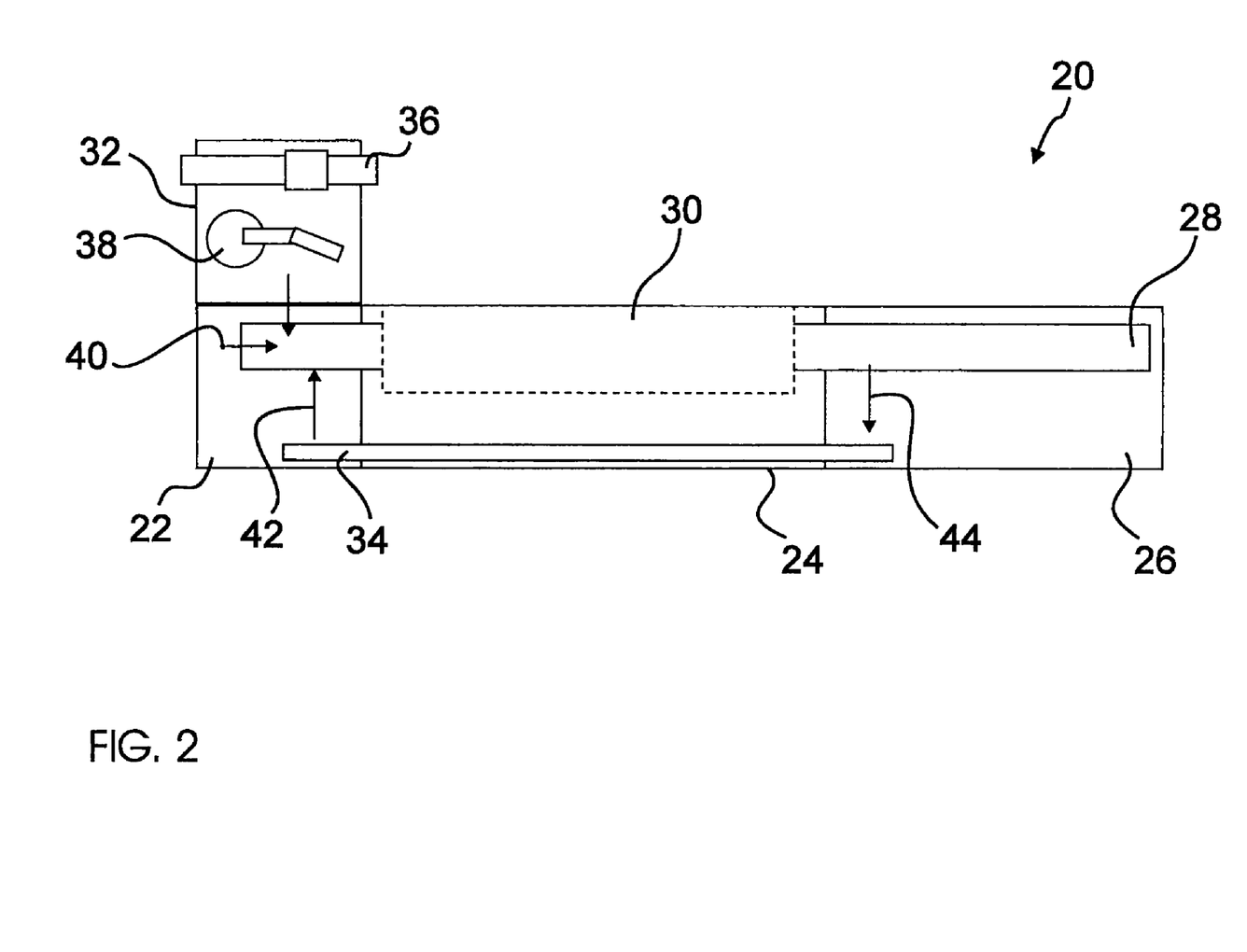
FIG. 2 shows a schematic illustration of a solar cell soldering apparatus according to the invention.

FIG. 2 shows a solar cell soldering apparatus schematically in the form of a block diagram, and indicated with the reference numeral 20. This schematic illustration is intended to provide a general explanation of the method of operation of the solar cell soldering apparatus, and because of this does not show any technical details. In general, a solar cell soldering apparatus 20 such as this is also referred to for short as a stringer, since this apparatus can be used to join a plurality of other solar cells together to form a so-called string. The solar cell soldering apparatus will therefore be referred to for short as a stringer 20 in the following text.

As already stated in the introductory part of the description, a plurality of individual solar cells 10, as shown in FIGS. 1a, 1b, 1c, are joined together to form a string. Strips 12, 13 are used for mechanical and electrical connection of adjacent solar cells with a strip pair in the case of the solar cell or product variant shown in FIG. 1a, running from the upper face of one solar cell to the lower face of the adjacent solar cell. The profile of the strips 12, 13 can clearly be seen in FIG. 1a, and therefore this will not be described in any more detail. FIGS. 1b, 1c show rear-face contact cells in which the connections are made exclusively on the rear face of the solar cells.

The stringer according to the invention can therefore process both solar cells with front and rear face contacts or else rear-face contact cells. The function of the retaining means running concomitantly remains unchanged. In the case of rear-face contact cells, the solar cells are not touched by halves of pliers or the like on the side facing the sun, which is sensitive to scratching and damage.

The following text will refer only to the cells shown in FIG. 1a as being represented in rear-face contact cells and solar cells with front and rear faces.

In principle, in order to produce a solar cell string 16 such as this, it is necessary to place the required individual solar cells precisely with respect to one another, and to fit the respective strips. The unit comprising the solar cells 10 and strips 12, 13 must be soldered when the items alight precisely with respect to one another. Until now, in the prior art, this has been done either by firmly clamping the solar cells of a string 16 on a transport plate and then transporting it into a soldering device, preferably a soldering oven. In another known solution, the two strips of a strip pair would first of all be soldered on one solar cell, before the solar cell was positioned.

The stringer 20 according to the invention takes a different approach to these known principles and provides a form of continuous flow manufacture for solar cell strings 16.

The stringer 20 comprises a plurality of modules, for example 32, 22, 24, 26, which carry out the necessary process steps successively. Product-specific or customer-specific process intermediate steps can also be inserted at any time between these process steps. These process intermediate steps may be associated with one of the modules mentioned in the following text, or may form an autonomous new module.

For this purpose, the stringer 20 comprises a first module or placement module 22, which is used to place the solar cells 10 and the strips 12, 13 in their correct position with respect to one another.

The placement module 22 is followed directly or after process intermediate steps by a second module or connecting soldering module 24, which has a soldering oven 30 or a soldering device. The soldering module 24 is finally followed by a fourth module or post-processing module 26, in which, for example, test procedures are carried out in order to test the completed solar cell strings 16 or, for example, the placement of the strings on to a glass plate.

The modules 22, 24 and 26 which have been mentioned have a third associated module or transport module 28 which has at least one conveyer belt which runs from the first module 22 to the fourth module 26, and transports the solar cells.

Furthermore, FIG. 2 shows a fifth module or magazine module 32, which is fitted to the first module 22 and comprises a magazine transport unit 36 and a cell movement and positioning device, for example a robot 38. This magazine module is used to provide individual solar cells 10 in magazines, which are moved into the handling area of the robot 38 by means of the magazine transport unit 36. The robot 38 successively takes the individual solar cells out of this magazine and places them on the conveyer belt in the area of the placement module 22. Depending on the requirement, further process intermediate steps which act on a single solar cell which has not yet been connected are also carried out in the meantime. For example, testing and/or alignment of the solar cell mechanically or by means of image processing.

The first module 22 has an associated strip supply unit 40 in order to supply the strips 12, 13.

Finally, the stringer 20 from FIG. 2 also has a back-transport unit 34, which transports the so-called retaining elements, which will be explained in detail in the following text, back from the fourth module 26 to the first module 22. For cycle time reasons, this back-transport unit 34 may also be duplicated, that is to say arranged on both sides, to the left and right of 28. In the first module 22, the retaining elements are placed on the solar cells by means of a handling device 42 and are lifted off the solar cells again by an appropriate handling device 44 in the area of the fourth module 26, and are transported back.

The stringer 20 shown schematically in FIG. 2 now carries out the following function (the procedure is an example for solar cells with front/rear-face contacts as shown in FIG. 1). The invention allows a multiplicity of different string product variants to be produced during the processing of rear-face contact cells, by means of software and a procedure change in the control program. This is a further advantage.

The cell transport device, for example a robot 38, takes a single solar cell 10 from a solar cell magazine in the magazine transport unit 36 and transports it to the placement module 22, in order to place it on the conveyer belt of the transport module 28, there. The strip pair comprising the two strips 12, 13 is then placed via the strip supplier unit 40 on the upper face of the solar cell, with a longitudinal section of the two strips 12, 13 in each case projecting beyond the solar cell and resting on the conveyer belt.

The handling unit 42 then places so-called retaining elements on the solar cell in such a way that the two strips 12, 13 are pressed on to the solar cell, and the two strips 12, 13 are likewise pressed underneath the solar cell, and in consequence are fixed relative to it. The handling unit 42 can also be designed such that it handles both strips and retaining elements. In this case, for example, strips and a retaining element can be placed on the solar cells at virtually the same time.

In the next step, the conveyer belt is moved onward by one step, which corresponds approximately to the length of one solar cell, so that the loose unit comprising a solar cell, strip and retaining element is transported onwards by one position. The loose strip sections in the case of front-contact solar cells can be fixed during the cycle by means of the conveyer belt and the suction openings located in it.

The cell transport device 38 then picks a new solar cell out of the magazine and places it on the conveyer belt, with the two projecting longitudinal sections of the strips 12, 13 now being located under the solar cell placed there. Two strips are then once again placed on this solar cell via the strip supply unit 40 and the process mentioned above is repeated until a desired number of solar cells for a string has been reached.

If the electrical connection is produced by means of more than two strips, then correspondingly more strips are placed in position.

This applies to the solar cells as described in FIG. 1a. In the case of rear-face contact cells, for example, as shown in FIGS. 1b, 1c, the solar cell is placed, first of all, by the cell transport device 38, on the conveyer belt and the strips are then placed on the rear faces of the two solar cells. The retaining element fixes the strips on the two solar cells.

The units located on the conveyer belt, comprising a solar cell, strips and retaining element, are passed cyclically through the (soldering) oven 30 or soldering device 30 (also referred to in the following text just as a soldering oven, as appropriate), and heated there in order to mechanically and electrically connect the strips to the solar cells. The soldering methods which can be used for this purpose are generally known and they will therefore not be described in any more detail at this point.

After passing through the soldering oven or the soldering device 30, the retaining elements are picked up again via the handling unit 44 in the area of the fourth module 26 and are transported back to the placement module 22 by means of the back-transport unit 34. Since the soldering process results in a mechanical joint between the individual solar cells, there is therefore no longer any need for these retaining elements.

The mechanically robust string 16 is finally post-processed in the fourth module 26, with this post-processing for this purpose also including test procedures for electrical testing of the string 16. Since this post-processing is not significant to the invention, it will not be described in any more detail here.

Figure 3:
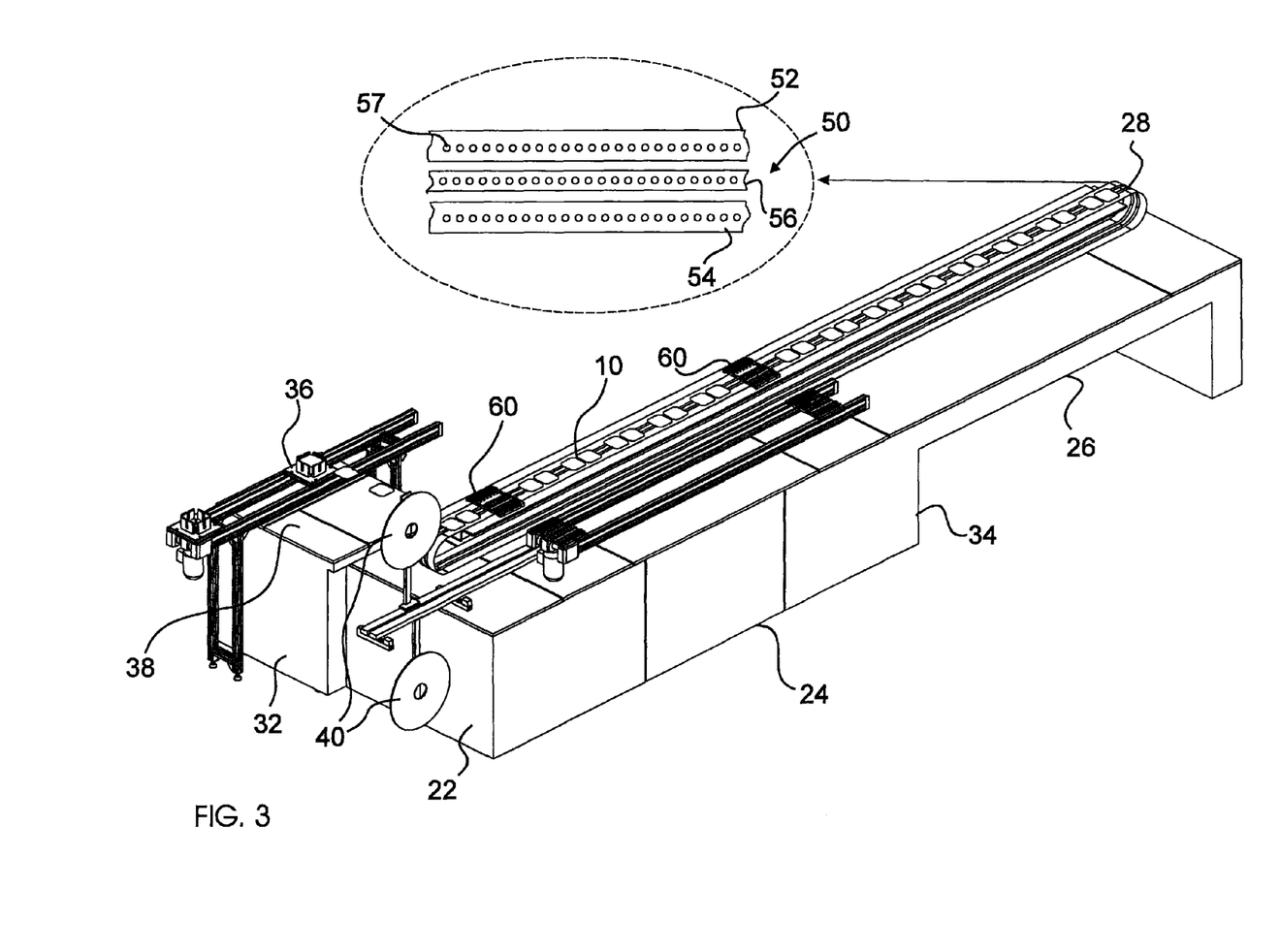
FIG. 3 shows a schematic perspective illustration of a solar cell soldering apparatus according to the invention.

FIG. 3 shows the general configuration of a stringer 20, once again in the form of a perspective illustration. This shows the modular design particularly well, with this being advantageous particularly during the planning of a stringer 20 since individual modules which have already previously been planned can be joined together like building blocks. The modular design therefore makes it possible, for example, to place the magazine module 32 on different sides of the placement module 22. The individual dimensions of the modules and the attachment apparatuses are designed for this purpose, that is to say a certain amount of standardization is achieved for dimensions and attachment options. The same applies in general to the other subsequent modules 24, 26 and 28. For example, the second module 24, to which the solder oven is fitted may have a different length, in order for example to take account of different soldering methods. The different lengths of this second module 24 have no influence on the modules 22 and 26 located in front of and behind it, however, since the interfaces and corresponding dimensions are standardized.

The transport module 28 is shown in more detail in the perspective view in FIG. 3. The transport module 28 comprises a conveyer belt unit 50 which comprises a total of three individual conveyer belts 52, 54 and 56. However, this number of individual conveyer belts is purely exemplary and depends solely on the type of solar cell, in particular its size. By way of example, the conveyer belt 56 can itself be subdivided into a plurality of individual conveyer belts.

The three conveyer belts 52 to 56 shown in FIG. 3 run parallel to one another and are driven by a common drive, which is not shown in the figure. This ensures that the three conveyer belts move synchronously. As has already been indicated, the conveyer belts are not moved continuously but in steps, in order to pass the solar cells cyclically through the stringer 20.

The conveyer belts 52 to 56 are preferably made of metal, although other materials are also possible. However, when choosing the conveyer belt materials care should be taken to ensure that they are heat-resistant, since the conveyer belts pass through the soldering oven or the soldering/connecting device and are therefore subject to relatively high temperatures.

As can likewise be seen from FIG. 3, the conveyer belts have holes 57 which are arranged at uniform intervals in the longitudinal direction of the conveyer belt. The function of these holes 57 will be explained later.

Finally, FIG. 3 also shows retaining elements which are indicated with the reference numeral 60. As already indicated, these retaining elements are each placed on one solar cell 10 in the placement module 22, in order to press the strips 12, 13 on to the solar cell 10. For transportation, the retaining elements 60 rest on the two outer conveyer belts 52 and 54, while the solar cells 10 rest on the central conveyer belt. This results in the mechanical separation of the transportation of the retaining elements 60 and of the solar cells 10, although the appropriate synchronization of the drive must ensure that the unit comprising the solar cell 10 and the retaining element 60 is moved synchronously. In order to ensure reliable placing of the strips on the solar cells during transportation and through the solder oven, there must be no relative speed between the solar cell 10 and the retaining element 60.

At this point, it should be noted that FIG. 3 shows only two retaining elements 60, for simplicity reasons. However, one retaining element is used for each solar cell in practice.

The retaining elements 60 are lifted off the conveyer belts 52, 54 for example by means of a simple movement device (not shown) in the area of the fourth module 26 after passing through the soldering oven and are placed on the back-transport unit 34, which, for example, can likewise consist of two conveyer belts, and are transported back to the placement module 22.

Figure 4:
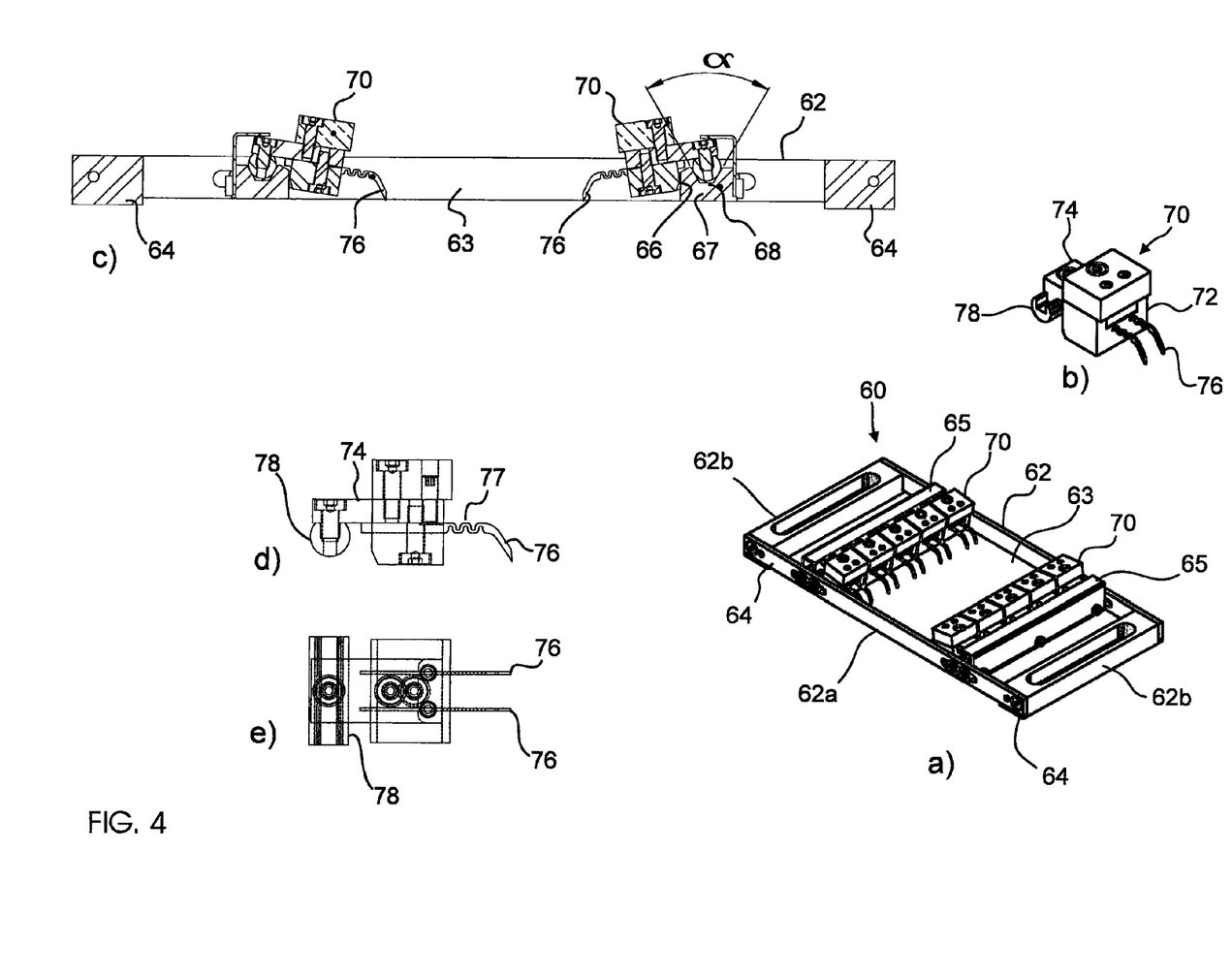

FIG. 4 now shows a plurality of schematic illustrations of a retaining element, in general indicated with the reference numeral 60. The general design of a retaining element 60 can be seen very well in FIG. 4a. The retaining element 60, also referred to for short in the following text as a retaining means, comprises a frame 62, which, for example, may also be formed just in a c-shape, that is to say need not necessarily be closed, comprising frame elements 62a which run transversely (with respect to the transportation direction of the retaining means) and frame elements 62b connecting them. A different configuration of the frame 62 is, of course, also feasible.

The essential feature for the design of the frame 62 is that a window 63 remains in the center, whose function will be explained later.

The two side frame elements 62b each have a contact surface 64 on their lower face, which contact surface 64 is as flat as possible, for example having suction pockets. The retaining means 60 is placed over these contact surfaces 64 on the two conveyer belts 52, 54 which have already been mentioned (FIG. 3).

Frame bars 67 are provided parallel to the two side frame elements 62b (see FIG. 4c) and are attached to the frame elements 62a. The two frame bars 67 bound with the window 63 in the lateral direction.

Two frame bars 67 comprise V-shaped grooves 68 which are open at the top and extend over their entire length.

The retaining means 60 comprise a multiplicity of retaining heads 70 which are arranged in a plurality of rows parallel to the frame bars 67. This can be seen very well in FIG. 4a.

Each retaining head 70 comprises a body 72 which holds at least one and preferably two retaining needles 76. An arm 74 is fitted to the body 72 on the side opposite the retaining needles and is attached to a rod 78. This rod 78 extends over a retaining head 70 and is guided in the abovementioned V-groove. A plurality of retaining heads 70 in a row and the associated bar 67 therefore form a mechanical unit.

This mechanical unit is supported in the frame 62. For this purpose, the rods 78 of the unit are located in the V-shaped groove 68, with a holding bar 65 being provided on the frame bar 67 in order to prevent the retaining heads from being able to fall out of the V-groove 68.

At this point, it should be noted that one continuous rod 78 may be used instead of individual rod segments 78'. In the case of rod segments for which in each case one rod segment 78' is associated with a retaining head 70, this variant has the advantage over one common rod per row of greater flexibility, although the method of operation remains the same.

As can be seen from FIG. 4c, the body 72 of each retaining head 70 is located in the area of the window 63. The support of the unit comprising retaining heads 70 in the V-groove 68 allows the unit (or the individual retaining heads when using rod segments) to pivot through a specific selectable angle.

This pivoting range and the shape of the retaining needles 76 are chosen such that the needles press on the strips 12, 13, when the retaining means 60 is placed on a solar cell 10. The contact force, with which the strips are pressed on to the solar cell, can be provided by an appropriate adjustment of the weight of the body 72. However, care should be taken to ensure that the retaining heads 70 do not strike against a stop 66 on the frame bar 67 after being placed in position. The retaining heads 70 should strike this stop 66 only when they are not resting on a solar cell, that is to say when the retaining needles are located freely.

As has already been mentioned above, the retaining means 60 pass through the solder oven 30 together with the solar cells and the strips. The window 63 that has been mentioned is provided in order to allow heat to be supplied as well as possible to the strips to be soldered. In consequence, solder energy, for example in the form of hot gas or hot air or laser light, can be supplied via this window 63.

As can be seen well in FIG. 4d, the retaining needle 76 has a meandering section 77 which ensures a resilient function. It is therefore possible to compensate for tolerances, for example, in the form of height differences between adjacent retaining needles, since retaining needles 76 which project to a particularly great extent downwards can spring upward when placed on the solar cells, until the other retaining needles likewise make contact.

In consequence, in principle, the retaining needles 76 in one row of retaining heads 70 are used to press a strip 12 or 13 that is located on the solar cell 10 on to the solar cell and thus to fix it. Since the retaining means 60 are transported with the solar cell 10, this fixing of the strips on the solar cell can be maintained during transportation.

Figure 5:
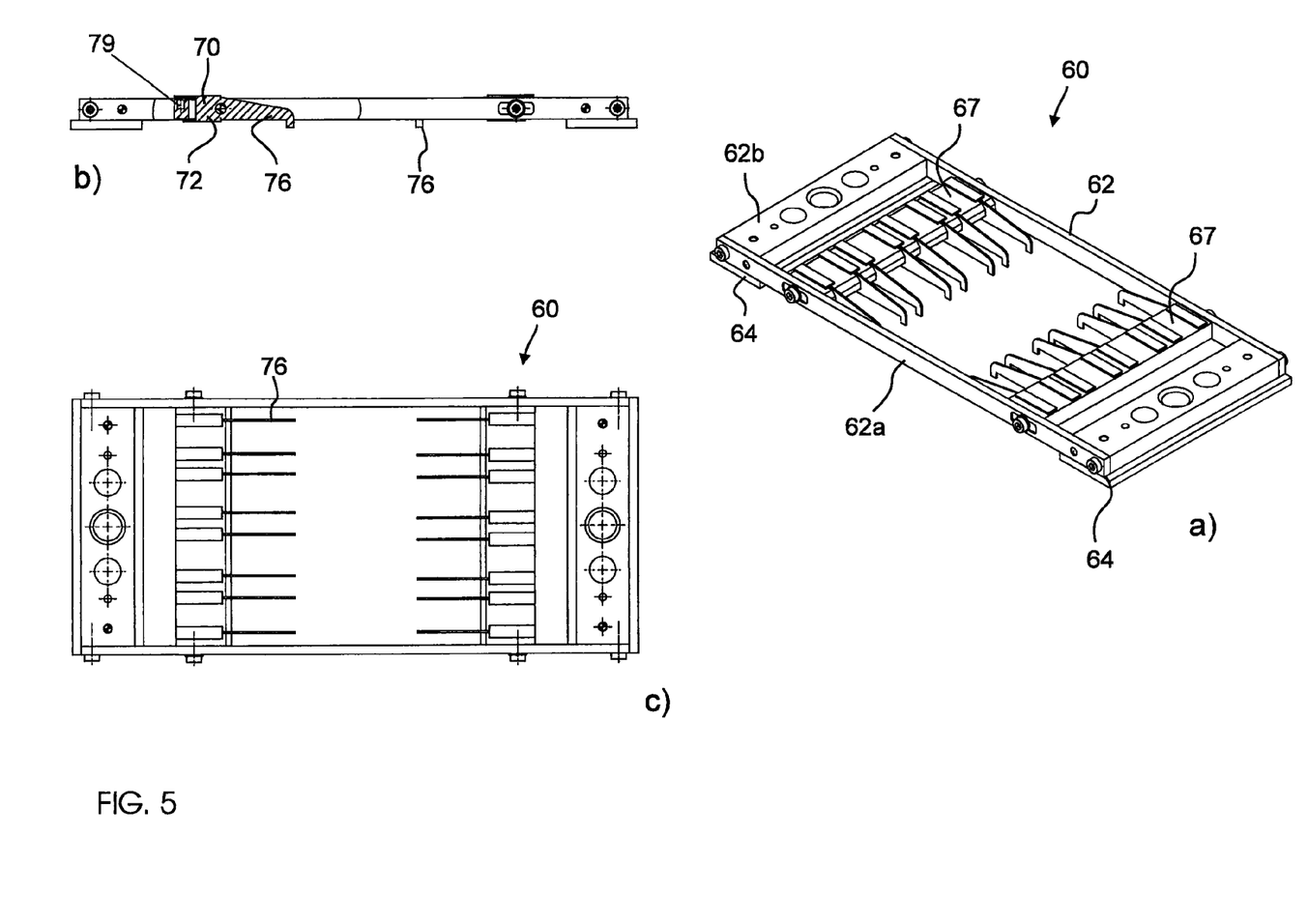

In the example shown in FIG. 4, the contact force is achieved by the weight of the body 72. It is, of course, also possible to apply this force by spring elements, so that the bodies 72 may be made smaller and lighter. A corresponding example is shown in FIG. 5, in which the general design of the retaining means 60 remains the same. In this embodiment variant, the retaining heads 70 are physically conceivably smaller, since the contact force is no longer achieved by their own weight but by means of springs. The retaining head body 72 can in consequence be made considerably smaller since its only function is attachment to the frame 62. Depending on the construction and connection technique, the springs are subject to a thermal stress which can have a disadvantageous effect on the spring effect. This problem is avoided in the weight solution.

"Effectively", the retaining heads 70 now comprise only the retaining needles 70 (without a meandering section) and a small retaining head body 72, via which each retaining head 70 is connected to the frame bar such that it can pivot. FIG. 5b schematically indicates a spring, which is indicated with the reference numeral 79. This spring presses the retaining needles 76 downwards.

As can also be seen well in FIG. 5 the tips of the retaining needles 76 project downward beyond the frame element 62a, so that, when the retaining means 60 is placed on a solar cell 10, they invariably make contact with the strips located on the solar cell.

Figure 6:
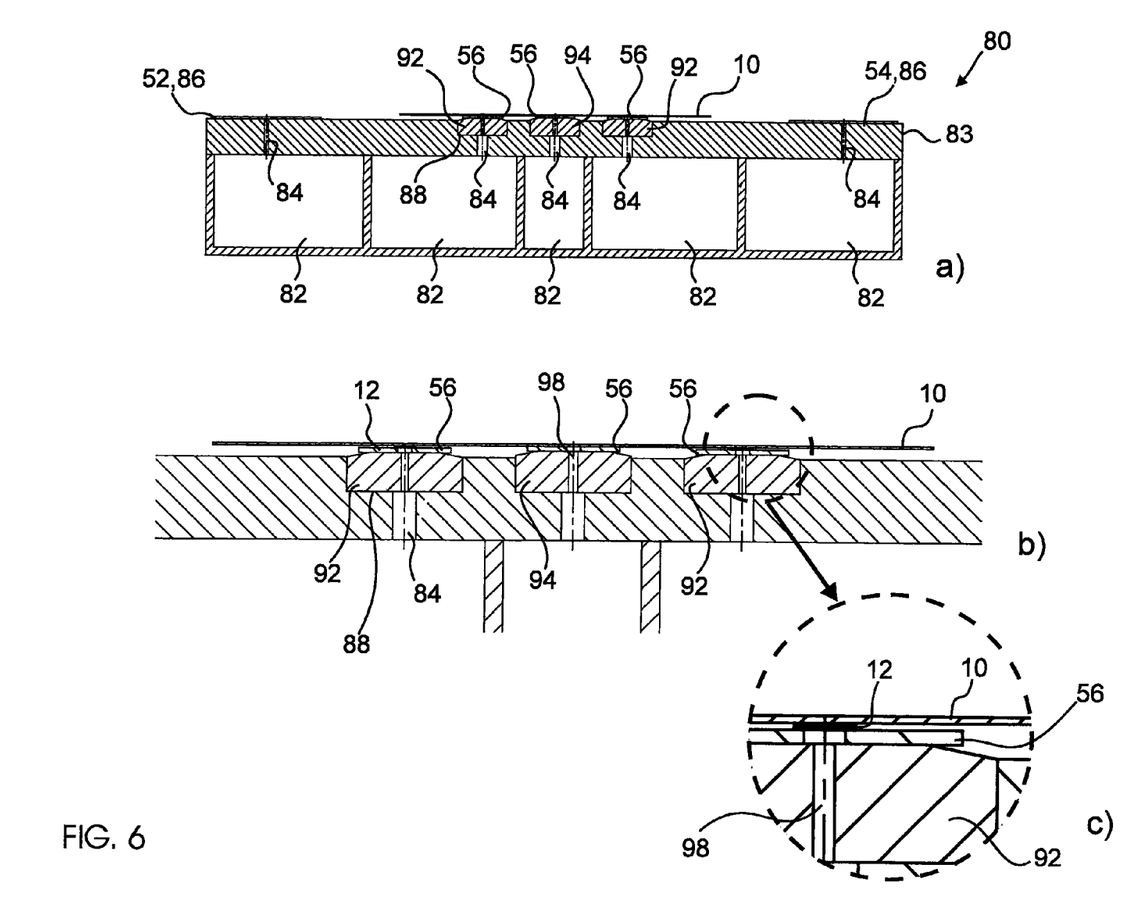

FIG. 6 shows a section view of a transport unit 80 which is part of the transport module 28. The transport unit 80 comprises a baseplate 83, to whose lower face a plurality of suction boxes 82 are fitted. Holes 84 or suction openings 84 are provided in the baseplate 83 and produce a connection from the suction box 82 to the upper face of the baseplate 83.

The baseplate 83 is essentially used to support the conveyer belts 52 to 56 which run parallel to it. The two outer conveyer belts 52, 54 rest directly on the baseplate 83, with the holes 57 indicated in FIG. 3 being aligned with the suction openings 84.

The suction openings 84, the holes 57, the respective conveyer belt 52 or 54 and the suction boxes 82 make it possible to suck the retaining means 60 resting thereon against them, and therefore to fix them on the conveyer belts. As mentioned already, the contact surface 64 is for this purpose designed so as to achieve as high a suction force as possible.

The conveyer belt 56 which is located on the center of the baseplate 83 is subdivided into three individual conveyer belts 56 and is used uniformly to support and transport the solar cells 10.

In contrast to the two conveyer belts 52, 54 it is possible for the conveyer belts 56 not to be supported directly on the baseplate 83, but for bars 92, 94 to be provided which extend in the transportation direction (at right angles to the plane of the drawing in FIG. 6) and support the respective conveyer belt 56. The two outer bars 92 are physically identical, but are different from the central bar 94. A bar 92 or 94 may be formed from a plurality of individual parts (referred to just as a bar in the following text).

Appropriate recesses 88 for holding these bars 92, 94 are provided in the baseplate 83 in such a way that the bars can be inserted easily into these recesses. The aim in this case is to ensure that these bars 92, 94 can be replaced quickly and easily.

Each of the bars 92 may have suction openings 98 which are then connected to suction openings 84 in the baseplate 83. The suction openings 98 in the bars 92, 94 need not, however, be provided over the entire bar length, but, depending on the application are provided where suction is required. Furthermore, the suction power can be adjusted within certain limits by a different grid spacing of the suction openings (that is to say different distances between the suction openings 98).

As has already been mentioned, the bars 92, 94 support the conveyer belts 56, as can be seen well in FIG. 6b. In this case, the conveyer belts 56 are aligned such that their holes 57 are aligned with the suction openings 98 in the bars. It is therefore possible to provide suction for the solar cell which has been placed on the conveyer belts 56, and thus to fix it on the conveyer belts.

As can be seen well in FIG. 1a, longitudinal sections of the two strips 12, 13 are located underneath each solar cell 10. The two outer conveyer belts 56 are now arranged such that they are located in the area of the strips 12 and 13. In consequence, in the case of solar cells with front and rear contacts, one strip 12 or 13 is in each case located between the solar cell and the conveyer belt 56 on the two outer bars 52, while the solar cell 10 in the area of the bar 94 rests directly on the conveyer belt 56.

This results in there being a height difference because of the thickness of the strips 12, 13, between the outer conveyer belts and the central conveyer belt, and this would lead to bending of the solar cell 10 if the bars 92, 94 were designed to be identical.

In order to prevent this, the two outer bars 92 have a height which is less than the central bar 94 by the thickness of the strips 12, 13. This makes it possible to ensure that the solar cell rests flat on the conveyer belts and the risk of fracture is considerably reduced.

Processing can be carried out without any height offset when processing rear-face contact cells which have no contacts on the side facing the sun.

Since the bars 92, 94 can be replaced easily, the transport unit 80 can be converted to different solar cells very quickly.

Furthermore, these bars allow individual adjustment for example of the suction power, by appropriate choice of the number of suction openings 98. Furthermore, other settings are likewise possible with the aid of this bar system without having to change the basic design of the transport unit 80.

Furthermore, these bars make it possible to supply power in order to assist soldering of the strips on the lower face of the solar cells, in order to provide specific sun insulation, etc.

Figure 7:
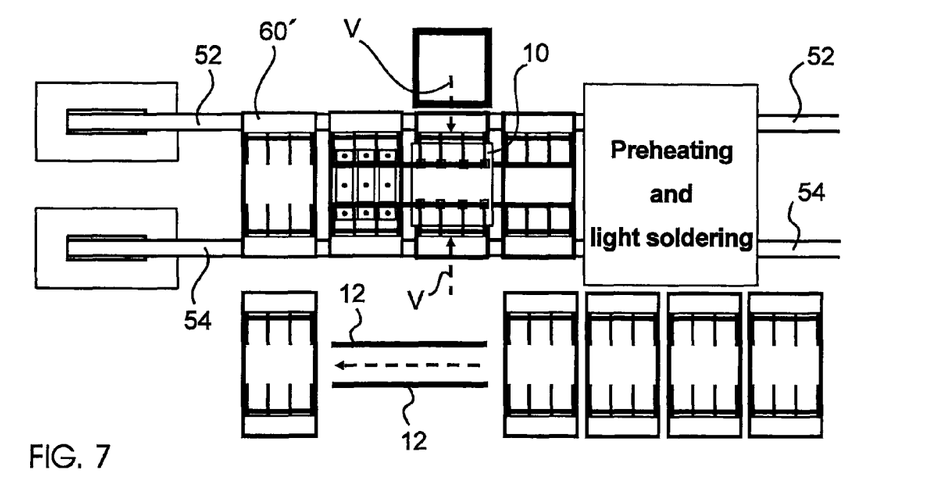
FIG. 7 shows a schematic block diagram of a solar cell soldering apparatus according to another embodiment.

FIG. 7 uses a schematic block diagram to show a further embodiment of a solar cell connecting apparatus. The basic design corresponds to that of the apparatus described already, so that parts which are indicated with the same reference numerals need not be described again.

One major difference in the embodiment shown in FIG. 7 is that the central conveyer belt 56 on which the solar cells are placed is omitted.

Instead of this, modified retaining elements 60' are used, which carry out the supporting function of the central conveyer belt 56.

Figure 8:
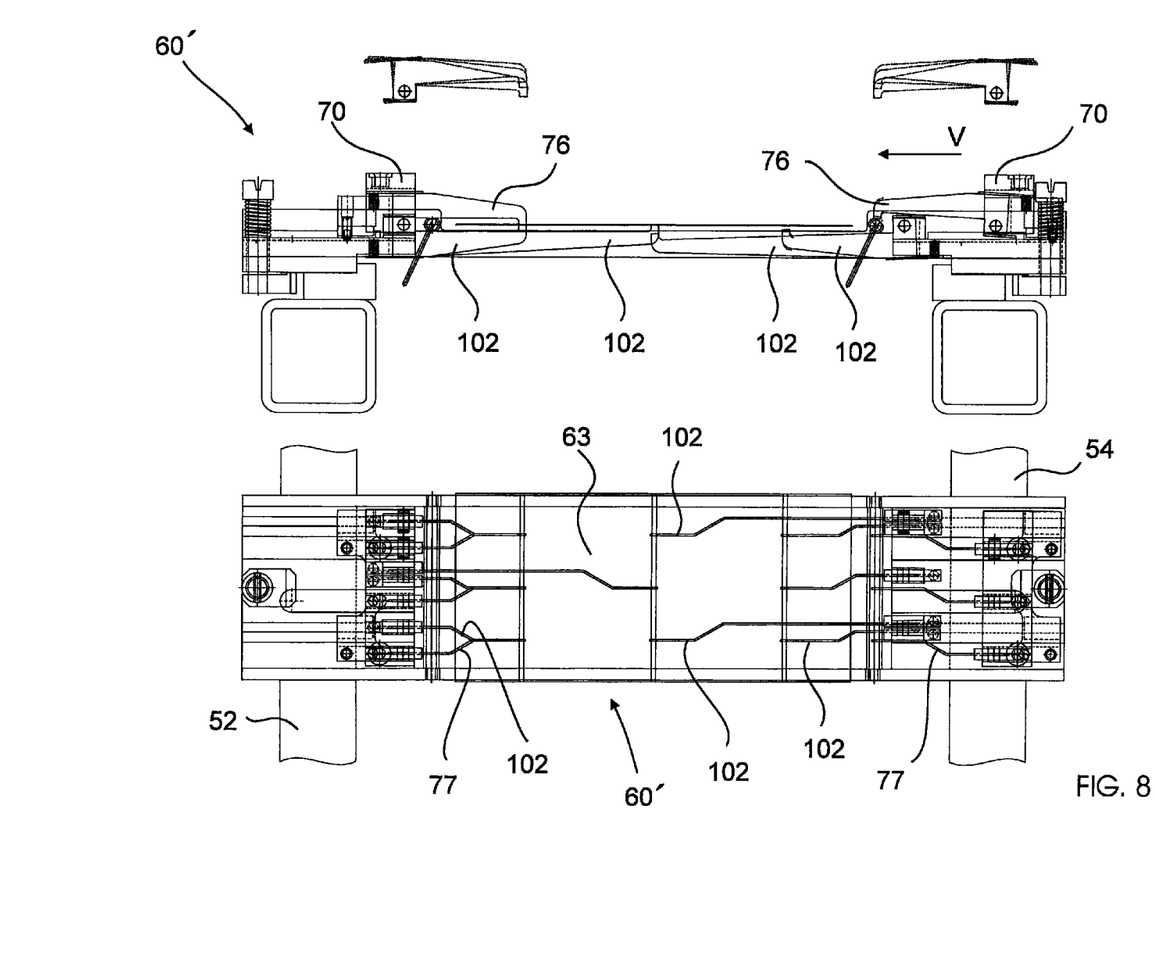
FIG. 8 shows a schematic illustration of a retaining element according to a further embodiment, which is matched to the design of the apparatus shown in FIG. 7.

In the embodiment shown in FIG. 7, the retaining element 60', as shown in FIG. 8, has supporting elements 102 which project inward into the area of the window 63 and are designed and positioned such that they support the strips located underneath and the solar cell located above them. The very slimline design of these supporting elements 102 means that only a small area of the lower face of the solar cell is covered, when viewed from underneath.

The small coverage of the lower face of the solar cells is advantageous when the connection process of strips to a solar cell is activated using light as a heat source.

In order additionally to ensure that the strips located on the upper face of the solar cell are fixed, the retaining heads 70 are designed such that, on the one hand they can be moved inwards and on the other hand then act downwards and press the strips on to the upper face of the solar cell.

In comparison to the embodiment explained in detail above, the fixing of the strips located at the top is not achieved by placing the retaining element on the solar cell but in fact by moving the retaining heads 70 inwards, as indicated for example, by the arrows V in FIG. 7. The upper section illustration in FIG. 8 shows, on the left, the retaining head 70 in the clamping position in which it has been moved inwards, and on the right hand side in the non-clamping position in which it has been moved outwards. Further details relating to the mechanical design of this retaining element 60' can be found in FIG. 8, so that these will not be described any further at this point. The basic design of the retaining heads and the retaining needles 76 corresponds to that of the retaining element 60, as has been described in detail above.

Figure 9:
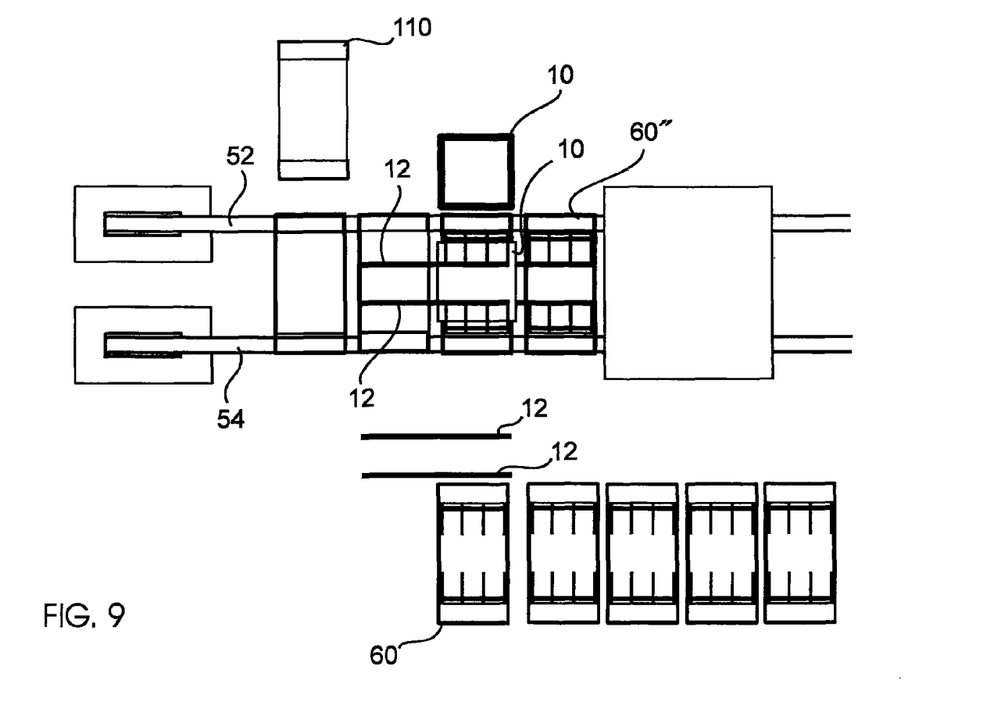
FIG. 9 shows a schematic block diagram of a solar cell connecting apparatus according to a further embodiment.

FIG. 9 shows a further embodiment of a solar cell connecting apparatus in the form of a schematic block diagram. For simplicity, in this case as well, parts which correspond to the embodiments which have already been described are identified by the same reference numerals and for this reason will not be explained in detail again.

This embodiment also dispenses with a central conveyer belt 56, so that the supporting function for the solar cells is once again carried out by the retaining elements 60".

Figure 10:
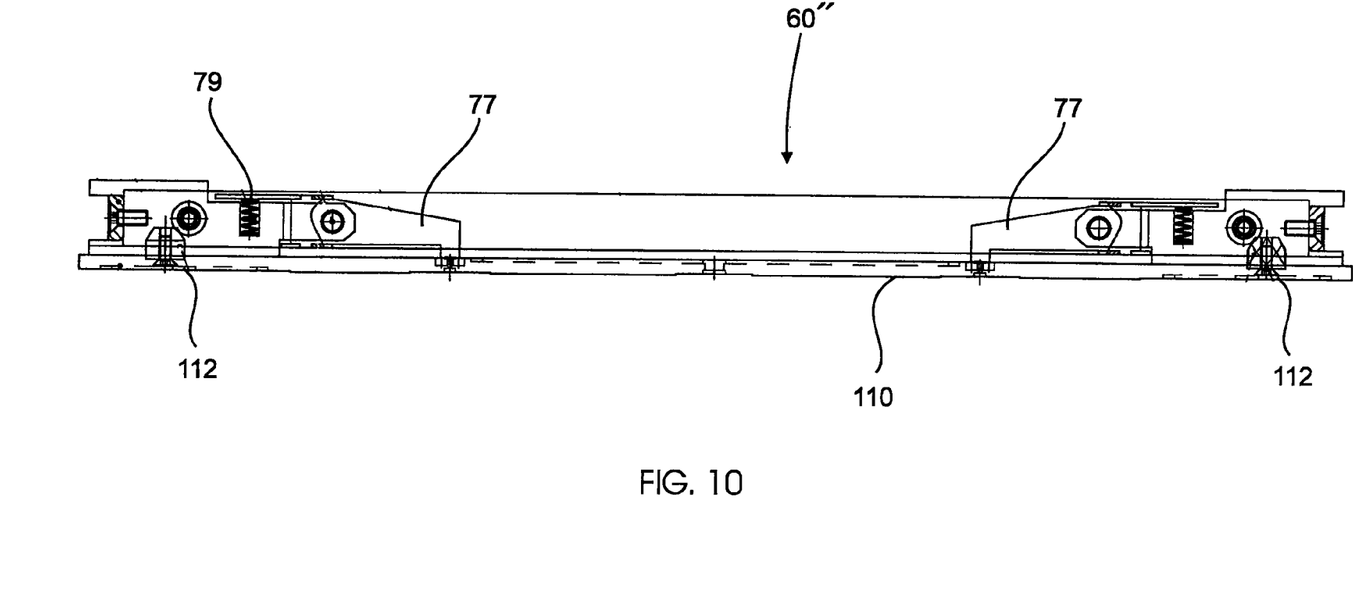
FIG. 10 shows a schematic illustration of a two-part retaining element which is matched to the solar cell connecting apparatus shown in FIG. 9.

In comparison to the variant of the retaining elements 60' shown in FIG. 8, the retaining element 60" is formed in two parts in the present case. On the one hand, it comprises an upper part, which is virtually identical to the retaining element 60 and on the other hand a lower part, which is in the form of a baseplate 110.

As can be seen in FIG. 9, the baseplate 110 is placed on the two conveyer belts 52, 54 and in consequence covers the area located in between. The strips 12 are placed on this baseplate 110 first of all, followed by the solar cell 10. In order to fix the strips placed on top, the upper part is placed on the baseplate 110, in the form of the retaining element 60.

The process procedure, that is to say the supply of strips, solar cells and the retaining element 60, corresponds to the process which has been described with reference to FIGS. 2 to 6. All that is now required is to supply the baseplate 110, in order to provide the supporting function of the central conveyer belt 56.

Modifications of the various embodiments explained above are, of course, possible. It is also feasible to combine individual features of various embodiments with one another.

Furthermore, it should be noted that the various embodiments of the solar cell connecting apparatuses can be used for different connection techniques, for example, soldering or conductive adhesion.

In summary it can be stated that the solar cell connecting apparatus according to the invention allows strings 16 to be produced in a highly flexible form and at a high cycle rate since, for example, the production need not be interrupted by moving a transport plate back as in the case of the prior art, and allows improvements to the process.

The retaining means 60 according to the invention allow the strips to be fixed on the solar cells in a simple manner without any negative influence on the soldering process.

Finally, the bar system according to the invention makes it possible to transport even highly sensitive solar cells which can be easily broken, safely, since it is possible to avoid any height difference caused by the strips. Furthermore, other characteristics, for example the suction power can be selected quickly and easily by means of the interchangeable bars.

Finally, it should also be noted that the described concepts according to the invention may be used not only on their own but also in conjunction with one another.

What is claimed is:

1. A strip retaining apparatus for use in a solar cell connection apparatus adapted to electrically connect together a multiplicity of individual solar cells using electrically conductive connector strips, the strip retaining apparatus comprising:
    a frame having frame elements defining a window in the central area, at least two of the frame elements having contact surfaces on an edge area thereof;
    a multiplicity of retaining heads arranged in at least two rows at opposite sides of the window, each of said retaining heads having a retaining needle, the retaining heads being pivotally supported on the frame to enable the retaining needles to move on to a strip.

2. The strip retaining apparatus as claimed in claim 1, wherein the contact surfaces are adapted to rest flat on conveyer belts of the connection apparatus.

3. The strip retaining apparatus as claimed in claim 1, wherein supporting elements are provided on the frame and support strips placed on them and a solar cell placed on them.

4. The strip retaining apparatus as claimed in claim 1, wherein a baseplate is provided which has contact surfaces in order to rest flat on the conveyer belts, and the frame is adapted such that it can be placed on the baseplate in order to fix a solar cell located on the baseplate, and the strips located underneath it.

5. The strip retaining apparatus as claimed in claim 1, wherein the retaining heads are pivoted by their own weight in order to move the retaining needles downwards towards the strips.

6. The strip retaining apparatus as claimed in claim 1, wherein the retaining heads each have at least one associated spring, which springs move the retaining needles downwards on to the strips.

7. The strip retaining apparatus as claimed in claim 1, wherein the retaining needles have a resilient, preferably meandering section.

8. The strip retaining apparatus as claimed in claim 1, comprising in each case one bearing bar, which is associated with a row of retaining heads, and has a V-shaped groove, with the retaining heads being mounted in the groove such that they can pivot.

9. The strip retaining apparatus as claimed in claim 1, wherein each retaining head has a plurality of retaining needles.

10. The strip retaining apparatus as claimed in claim 3, wherein the retaining heads can be moved inwards, with the retaining needles being pivoted downwards onto a strip during such movement.

* * * * *